(12) United States Patent
Cao

(10) Patent No.: US 11,387,419 B2
(45) Date of Patent: Jul. 12, 2022

(54) FLEXIBLE SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Ke Cao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/255,955

(22) PCT Filed: Feb. 21, 2020

(86) PCT No.: PCT/CN2020/076239
§ 371 (c)(1),
(2) Date: Dec. 23, 2020

(87) PCT Pub. No.: WO2020/215871
PCT Pub. Date: Oct. 29, 2020

(65) Prior Publication Data
US 2021/0273183 A1 Sep. 2, 2021

(30) Foreign Application Priority Data
Apr. 25, 2019 (CN) .......................... 201910339098.6

(51) Int. Cl.
*H01L 51/00* (2006.01)
*H01L 27/32* (2006.01)
*H05K 1/02* (2006.01)

(52) U.S. Cl.
CPC ...... *H01L 51/0097* (2013.01); *H01L 27/3244* (2013.01); *H05K 1/028* (2013.01);
(Continued)

(58) Field of Classification Search
CPC ......... H05K 2201/0206; H05K 1/0296; H05K 1/028; H01L 2251/5338; H01L 27/3244; H01L 51/0097
(Continued)

(56) References Cited

U.S. PATENT DOCUMENTS

2016/0172346 A1 6/2016 Koresawa
2019/0148653 A1 5/2019 Chen et al.

FOREIGN PATENT DOCUMENTS

CN 1819743 A 8/2006
CN 101150104 A 3/2008
(Continued)

OTHER PUBLICATIONS

ISA China National Intellectual Property Administration, International Search Report and Written Opinion Issued in Application No. PCT/CN2020/076239, dated May 25, 2020, WIPO, 17 pages.
(Continued)

*Primary Examiner* — Tremesha S Willis
(74) *Attorney, Agent, or Firm* — McCoy Russell LLP

(57) ABSTRACT

The present disclosure provides a flexible substrate and a display device. The flexible substrate includes a flexible base substrate, and a wiring bonding structure disposed on the flexible base substrate and including a plurality of bonding leads. A filler is arranged between the bonding leads.

8 Claims, 1 Drawing Sheet

(52) U.S. Cl.
CPC .... *H05K 1/0296* (2013.01); *H01L 2251/5338* (2013.01); *H05K 2201/0206* (2013.01); *H05K 2201/10128* (2013.01)

(58) Field of Classification Search
USPC ........................................................ 361/749
See application file for complete search history.

(56) References Cited

FOREIGN PATENT DOCUMENTS

| | | |
|---|---|---|
| CN | 105093728 A | 11/2015 |
| CN | 107706156 A | 2/2018 |
| CN | 207338345 U | 5/2018 |
| CN | 109068478 A | 12/2018 |
| CN | 110061037 A | 7/2019 |
| KR | 20150138488 A | 12/2015 |

OTHER PUBLICATIONS

State Intellectual Property Office of the People's Republic of China, Office Action and Search Report Issued in Application No. 201910339098.6, dated Jun. 12, 2020, 17 pages. (Submitted with Partial Translation).

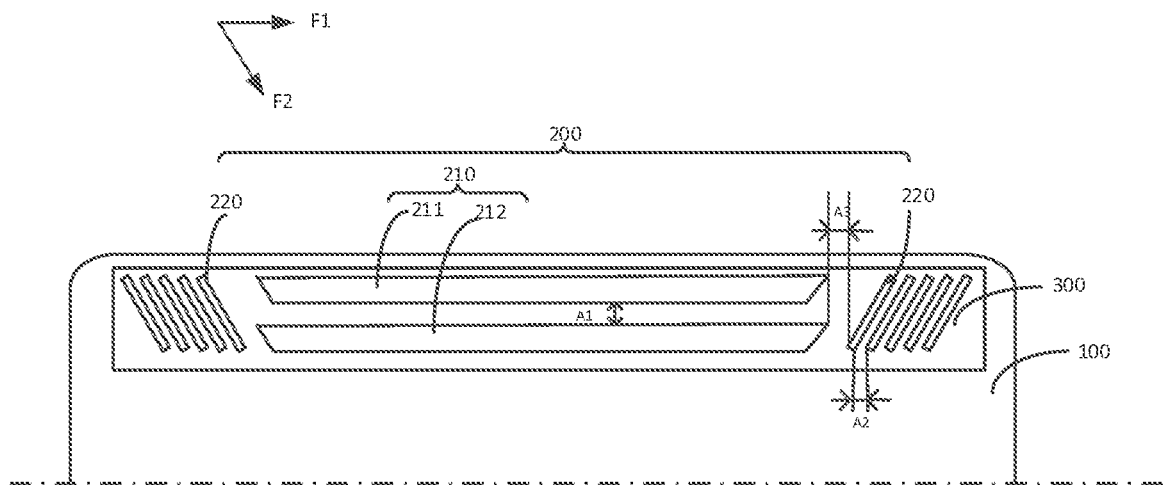

FLEXIBLE SUBSTRATE AND DISPLAY DEVICE

CROSS REFERENCE TO RELATED APPLICATION

The present application is a U.S. National Phase of International Patent Application No. PCT/CN2020/076239, entitled "FLEXIBLE SUBSTRATE AND DISPLAY DEVICE," and filed on Feb. 21, 2020. International Patent Application No. PCT/CN2020/076239 claims priority to Chinese Patent Application No. 201910339098.6 filed on Apr. 25, 2019. The entire contents of the above-listed applications are hereby incorporated by reference for all purposes.

TECHNICAL FIELD

The present disclosure relates to the field of display technology, in particular to a flexible substrate and a display device.

BACKGROUND AND SUMMARY

With the development of flexible display, such as Active-Matrix Organic Light-Emitting Diode (AMOLED) and other display markets, and with the continuous expansion of the production scale of flexible display panels, a proportion of the flexible display panels in the entire display industry has increased. In addition, such flexible display panels as high-resolution AMOLED display panels have become a development trend. However, the yield of the flexible display panels, e.g., the AMOLED display panels, has always been a challenge in the industry.

In one aspect, the present disclosure provides in some embodiments a flexible substrate, including a flexible base substrate, and a wiring bonding structure disposed on the flexible base substrate and including at least two rows of bonding wirings. A filler is arranged between two adjacent rows of bonding wirings.

In a possible embodiment of the present disclosure, each row of bonding wirings includes a plurality of binding leads, and the filler is filled in a gap between the plurality of binding leads.

In a possible embodiment of the present disclosure, the wiring bonding structure further includes at least two groups of dummy wirings distributed on opposite ends of the at least two rows of bonding wirings and configured to mark positions of the opposite ends of the at least two rows of bonding wirings, and the filler is arranged between each group of dummy wirings and the at least two rows of bonding wirings.

In a possible embodiment of the present disclosure, each group of dummy wirings includes a plurality of dummy leads, and the filler is arranged between the plurality of dummy leads In a possible embodiment of the present disclosure, in the at least two rows of bonding wirings, a row direction of each row of bonding wirings is a first direction, an extension direction of each dummy lead is a second direction intersecting the first direction at an angle.

In a possible embodiment of the present disclosure, a length of each dummy lead in the second direction is greater than a width of a gap between two adjacent rows of bonding wirings in the second direction.

In a possible embodiment of the present disclosure, the length of each dummy lead in the second direction is greater than the width of the gap between the two adjacent rows of bonding wirings in the second direction by 10 μm to 20 μm.

In a possible embodiment of the present disclosure, the quantity of dummy leads in each group of dummy wirings is 3 to 10.

In a possible embodiment of the present disclosure, a width of a gap between each dummy lead and the at least two rows of bonding wirings is 3 to 5 times a width of a gap between two adjacent dummy leads.

In a possible embodiment of the present disclosure, the filler is a polyimide film.

In a possible embodiment of the present disclosure, a thickness h of the filler on the flexible base substrate and a thickness H of each binding lead on the flexible base substrate satisfy: $h/H=(0.5\text{-}0.8)$ In another aspect, the present disclosure provides in some embodiments a display device, including the above-mentioned flexible substrate.

BRIEF DESCRIPTION OF THE FIGURES

FIG. 1 is a schematic view of a wiring bonding area of a flexible substrate according to one embodiment of the present disclosure.

DETAILED DESCRIPTION

At present, in a high-resolution flexible display panel, e.g., an AMOLED display panel, usually a wiring is designed as a double-row structure for a high-resolution AMOLED's Outer Lead Bond (OLB) in bonding area (Bonding) due to space constraints. In a high-temperature and high-pressure process for MDL-OLB, horizontal or vertical cracks easily occur for a gap between the leads in the double-row structure due to a temperature stress and polyimide (PI) deformation, and the yield of such flexible products as high-resolution AMOLED display panel is adversely affected by the cracks. The principles and features of the present disclosure will be described below in conjunction with the drawings. The following embodiments are for illustrative purposes only, but shall not be construed as limiting the scope of the present disclosure.

As mentioned hereinabove, in the related art, the cracks easily occur for the bonding area of the flexible substrate in a high-temperature and high-pressure process due to the temperature stress and the PI deformation. An object of the present disclosure is to provide a flexible substrate and a display device, so as to prevent the occurrence of the cracks in the bonding area of the flexible display product and improve the product yield. The flexible substrate in the embodiments of the present disclosure includes a flexible base substrate 100, and a wiring bonding structure 200 disposed on the flexible substrate 100 and including at least two rows of bonding wirings 210. A filler 300 is arranged between two adjacent rows of bonding wirings.

According to the flexible substrate in the embodiments of the present disclosure, the filler 300 may be filled in a gap between bonding leads of the wiring bonding structure 200, so as to reduce a height difference between the bonding lead and any other film layer on the flexible substrate. As a result, it is able to prevent the occurrence of cracks for a bonding area of the flexible substrate in a high-temperature and high-pressure process due to a temperature stress and PI deformation.

It should be appreciated that, the flexible substrate in the embodiments of the present disclosure may be an AMOLED flexible substrate or a flexible substrate of any other type, such as an AMOLED substrate.

The flexible substrate will be described hereinafter in more details by taking the AMOLED substrate as an example.

In an illustrative embodiment of the present disclosure, as shown in FIG. 1, each row of bonding wirings may include a plurality of bonding leads, and the filler 300 may be filled in a gap between the plurality of bonding leads 300 ().

Based on the above scheme, for the flexible substrate, especially high-resolution flexible substrate, due to space constraints, the bonding wirings 210 in the wiring bonding area are arranged in at least two rows, and a gap may exist between two adjacent rows of bonding wirings. When the filler 300 is filled in the gap between two adjacent rows of bonding wirings, it is able to effectively prevent the occurrence of cracks in the wiring bonding area in the high-temperature and high-pressure process.

Taking the AMOLED flexible substrate as an example, usually the wiring bonding structure 200 of the high-resolution AMOLED product is designed as a double-row structure. As shown in FIG. 1, a first row of bonding wirings 211 and a second row of bonding wirings 212 may be provided in the wiring bonding area. A first gap A1 may be formed between the first row of bonding wirings 211 and the second row of bonding wirings 212, and the filler 300 may be filled in the first gap A1 to prevent the occurrence of the cracks due to the height difference between the lead of the bonding wiring and the other film layer.

The wiring bonding structure may further include at least two groups of dummy wirings distributed on opposite ends of the at least two rows of bonding wirings and configured to mark positions of the opposite ends of the at least two rows of bonding wirings. The filler may be arranged between each group of dummy wirings and the at least two rows of bonding wirings. In addition, in the embodiments of the present disclosure, as shown in FIG. 1, two groups of dummy wirings may be distributed on opposite ends of the at least two rows of bonding wirings 210, and the filler 300 may be filled in a gap between each of the two groups of dummy wirings and each of the two rows of bonding wirings 210.

Each group of dummy wirings may include a plurality of dummy leads, and the filler may be arranged between the plurality of dummy leads.

Based on the above scheme, as shown in FIG. 1, during the manufacture of the flexible substrate, the dummy leads 220 for alignment and any other functions may also be arranged in the wiring bonding area, and the dummy leads 220 may be arranged at opposite ends of at least two rows of bonding wirings 210. As mentioned hereinabove, the filler 300 may be filled in a second gap A2 between the adjacent dummy leads 220, and in a third gap A3 between each of the plurality of dummy leads 220 and each of the at least two rows of bonding wirings 210. In this regard, it is able to further prevent the occurrence of the cracks due to the height difference between the lead of the bonding wirings and the other film layer.

The bonding leads may be formed by a conductive layer on the flexible base substrate, and the filler may be formed by a polyimide film at a same layer as the conductive layer.

In addition, in order to further prevent the occurrence of the cracks in the wiring bonding area, as shown in FIG. 1, in the embodiments of the present disclosure, in the at least two rows of bonding wirings 210, a row direction of each row of bonding wirings may be a first direction F1, and an extension direction of each dummy lead 220 may be a second direction F2 intersecting the first direction F1 at an angle. The dummy lead 220 may be arranged in such a manner as to directly face a gap between two adjacent rows of bonding wirings in the at least two rows of bonding wirings 210, and a length L of each dummy lead 220 in the second direction F2 may be greater than or equal to a width d of a gap between two adjacent rows of bonding wirings in the second direction F2.

Based on the above scheme, the bonding dummy lead 220 at the opposite ends of at least two rows of bonding wirings 210 may be arranges in such a manner as to directly face the first gap A1 between two adjacent rows of bonding wirings, and the length of each dummy lead 220 may be greater than the width of the gap between two adjacent rows of bonding wirings. In this way, through adjusting the length of the dummy leads 220 on both sides of the at least two rows of bonding wirings 210, it is able to prevent the occurrence of the cracks due to the existence of the first gap A1 between the at least two rows of bonding wirings 210.

In a possible embodiment of the present disclosure, as shown in FIG. 1, the length of each dummy lead 220 in the second direction F2 may be greater than the width of the gap between the two adjacent rows of bonding wirings in the second direction by 10 µm to 20 µm.

Based on the above scheme, through performing an FIB analysis on a region of a defective product where the at least two rows of wirings are located, observing cross-sectional morphology and data about the height difference, and simulating a cause for the cracks in conjunction with a crack shape, when the length of each dummy lead 220 in the second direction F2 is greater than the width of the first gap A1 between the two adjacent rows of bonding wirings by a length d' of 10 µm to 20 µm, it is able to effectively prevent the occurrence of the cracks. In the above scheme, through adjusting the length of the dummy leads 220 at the opposite ends of the at least two rows of bonding wirings 210 and filling the gap between the two adjacent bonding wirings with the filler 300, it is able to reduce the height difference between the bonding lead and the other film layer of the display substrate, thereby to prevent the occurrence of the cracks for the high-resolution flexible substrate during the manufacture of the bonding wirings.

Of course, it should be appreciated that, the above is merely an optional scheme, and the length of the dummy lead 220 may also be greater than the width of gap by any other value, which will not be particularly defined herein.

In addition, in a possible embodiment of the present disclosure, the quantity of the dummy leads 220 in each group of dummy wirings may be 3 to 10.

Based on the above scheme, at least 3 to 10 dummy leads 220 may be provided on each side of the at least two rows of bonding wirings 210, so as to effectively prevent the occurrence of the cracks in the wiring bonding area. In the above scheme, through adjusting the quantity of the dummy leads 220 and filling the gap between the adjacent bonding wirings with the filler 300, it is able to reduce the height difference between the bonding lead and the other film layer of the flexible substrate, thereby to prevent the occurrence of the cracks for the high-resolution flexible substrate during the manufacture of the bonding wirings.

Of course, it should be appreciated that, the above is merely an optional scheme, and the quantity of the dummy leads 220 will not be particularly defined herein.

In addition, as shown in FIG. 1, a width of the gap between each group of dummy wirings and the at least two rows of bonding wirings may be 3 to 5 times a width of a gap between adjacent dummy leads.

Based on the above scheme, through adjusting a distance between each of the at least two rows of bonding wirings 210 (Vss wirings) and the dummy lead 220 at each end of the at least two rows of bonding wirings 210 and filling the gap between the adjacent rows of bonding wirings with the filler 300, it is able to reduce the height difference between the bonding lead and the other film layer of the flexible substrate, thereby to prevent the occurrence of the cracks for the high-resolution flexible substrate during the manufacture of the bonding wirings.

In addition, in a possible embodiment of the present disclosure, the bonding lead may be formed by a conductive layer on the flexible base substrate 100, and the filler 300 may be formed by a polyimide film at a same layer as the conductive layer.

Based on the above scheme, the filler 300 may be formed by the polyimide film. The polyimide film has excellent flexibility, heat resistance, and when it is filled between the bonding leads, it is able to provide the flexible substrate with excellent flexibility. In addition, the polyimide film may be formed, in a simple manner, on the flexible substrate 100 through a half-tone process after an SD process (i.e., a process for forming the conductive layer) in a BP process (i.e., a process for forming a display substrate with a driving circuitry layer and a display element).

Of course, it should be appreciated that, in actual use, the filler 300 may also be made of any other insulating materials with excellent flexibility, which will not be particularly defined herein.

In addition, in the embodiments of the present disclosure, as shown in FIG. 1, a thickness h of the filler 300 on the flexible base substrate 100 and a thickness H of the bonding lead on the flexible base substrate 100 may satisfy: $h/H = (0.5\text{-}0.8)$.

Based on the above scheme, the filler 300 functions as to reduce the height difference between the bonding lead and the other film layer on the flexible substrate and thereby reduce the occurrence of the cracks. Hence, the filler 300 needs to be provided with such a thickness (i.e., the height h in a direction perpendicular to the flexible base substrate 100) as to achieve a buffering effect between the bonding lead and the other film layer. When the thickness h of the filler 300 and the height H of the bonding lead in the direction perpendicular to the flexible base substrate 100 satisfy $h=0.5H\text{-}0.8H$, a best effect may be achieved. In the embodiments of the present disclosure, taking the AMOLED substrate as an example, the thickness h of the filler 300 may be about 2 μm to 3 μm.

Of course, it should be understood that, for different flexible substrates, the structure of the bonding lead, such as the height H, may be adjusted according to the practical need.

In addition, the present disclosure further provides in some embodiments a display device including the above-mentioned flexible substrate. The display device may be a flexible display device, e.g., mobile phone and computer.

The technical effects will be described as follows.

According to the flexible substrate and the display device in the embodiments of the present disclosure, the filler may be filled in the gap between the bonding leads, so as to reduce the height difference between the bonding lead and the other film layer on the flexible substrate. As a result, it is able to prevent the occurrence of the cracks for the flexible substrate in the wiring bonding area, thereby to improve the yield.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A flexible substrate, comprising a flexible base substrate, and a wiring bonding structure disposed on the flexible substrate and comprising at least two rows of bonding wirings, wherein a filler is arranged between two adjacent rows of bonding wirings; wherein each row of bonding wirings comprises a plurality of bonding leads, the filler is further arranged between the plurality of bonding leads, the bonding leads are formed by a conductive layer on the flexible base substrate, and the filler is formed by a polyimide film at a same layer as the conductive layer; the wiring bonding structure further comprises at least two groups of dummy wirings distributed on opposite ends of the at least two rows of bonding wirings in the first direction and arranged at a same side of the flexible substrate, where the first direction is a row direction of each row of bonding wirings, the filler is further arranged between each group of dummy wirings and the at least two rows of bonding wirings, each group of dummy wirings comprises a plurality of dummy leads, the filler is further arranged between the plurality of dummy leads, an extension direction of each dummy lead is a second direction intersecting the first direction at an angle, each dummy lead is arranged in such a manner as to directly face a gap between two adjacent rows of bonding wirings in the at least two rows of bonding wirings, and a length of each dummy lead in the second direction is greater than or equal to a width of a gap between two adjacent rows of bonding wirings in the second direction.

2. The flexible substrate according to claim 1, wherein the wiring bonding structure is configured to mark positions of the opposite ends of the at least two rows of bonding wirings.

3. The flexible substrate according to claim 1, wherein the length of each dummy lead in the second direction is greater than the width of the gap between the two adjacent rows of bonding wirings in the second direction by 10 μm to 20 μm.

4. The flexible substrate according to claim 1, wherein the quantity of dummy leads in each group of dummy wirings is 3 to 10.

5. The flexible substrate according to claim 4, wherein a width of a gap between each group of dummy wirings and the at least two rows of bonding wirings is 3 to 5 times a width of a gap between two adjacent dummy leads.

6. The flexible substrate according to claim 1, wherein a thickness h of the filler on the flexible base substrate and a thickness H of each bonding lead on the flexible base substrate satisfy: $h/H=(0.5\text{-}0.8)$.

7. A display panel, comprising the flexible substrate according to claim 1.

8. A display device, comprising the flexible substrate according to claim 1.

* * * * *